US006673520B2

(12) United States Patent
Han et al.

(10) Patent No.: US 6,673,520 B2
(45) Date of Patent: Jan. 6, 2004

(54) METHOD OF MAKING AN INTEGRATED CIRCUIT USING A REFLECTIVE MASK

(75) Inventors: Sang-in Han, Phoenix, AZ (US); Pawitter Mangat, Gilbert, AZ (US); James R. Wasson, Gilbert, AZ (US); Scott D. Hector, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 135 days.

(21) Appl. No.: 09/939,184

(22) Filed: Aug. 24, 2001

(65) Prior Publication Data

US 2003/0039922 A1 Feb. 27, 2003

(51) Int. Cl.[7] .............................. G03F 7/00; G03F 7/20
(52) U.S. Cl. ........................ 430/313; 430/5; 430/311; 430/314; 430/316; 430/317; 430/322; 430/323; 430/324; 430/394
(58) Field of Search .............................. 430/5, 311, 313, 430/314, 316, 317, 322, 323, 324, 394

(56) References Cited

U.S. PATENT DOCUMENTS

| | | | | |
|---|---|---|---|---|
| 5,052,033 | A | | 9/1991 | Ikeda et al. ................... 378/35 |
| 5,928,817 | A | | 7/1999 | Yan ................................ 430/5 |
| 5,935,737 | A | * | 8/1999 | Yan ................................ 430/5 |
| 6,013,399 | A | * | 1/2000 | Nguyen ......................... 430/5 |
| 6,204,159 | B1 | * | 3/2001 | Chang et al. ................ 438/594 |
| 6,514,877 | B1 | * | 2/2003 | Beauvais et al. ............ 438/763 |
| 2003/0000921 | A1 | * | 1/2003 | Liang et al. .................. 216/59 |

OTHER PUBLICATIONS

Wasson et al., "An Infinitely Selective Repair Buffer for EUVL Reticles," Proceedings of SPIE, vol. 4343, 2001, pp. 402–408.

Interantional Search Report (PCT/US02/24628).

Pettibone et al., "UV Inspection of EUV and SCALPEL Reticles," 20th Annual BACUS Symposium on Photomask Technology, Proceedings of SPIE, vol. 4186, pp. 241–249 (2001).

Mangat et al, "EUV Mask Fabrication with Cr Absorber," Emerging Lithographic Technologies IV, Proceedings of SPIE, vol. 3997, pp. 76–82 (2000).

Mangat et al., "Extreme Ultraviolet Lithography Mask Patterning and Printability Studies with a Ta–based Absorber," J. Vac. Sci. Technol. B., American Vacuum Society, 5 pgs. (1999).

Yan et al. "EUV Mask Patterning Approaches," SPIE Conference Emerging Lithographic Technologies, vol. 3676, pp. 309–313 (1999).

(List continued on next page.)

Primary Examiner—Mark F. Huff
Assistant Examiner—Nicole Barreca
(74) Attorney, Agent, or Firm—James L. Clingan, Jr.; Kim-Marie Vo

(57) ABSTRACT

A desired pattern is formed in a photoresist layer that overlies a semiconductor wafer using a reflective mask. This mask is formed by consecutively depositing a reflective layer, an absorber layer and an anti-reflective (ARC) layer. The ARC layer is patterned according to the desired pattern. The ARC layer is inspected to find areas in which the desired pattern is not achieved. The ARC layer is then repaired to achieve the desired pattern with the absorber layer protecting the reflective layer. The desired pattern is transferred to the absorber layer to reveal the reflective portion of mask. Radiation is reflected off the reflective mask to the semiconductor wafer to expose the photoresist layer overlying the semiconductor wafer with the desired pattern.

20 Claims, 3 Drawing Sheets

OTHER PUBLICATIONS

Yan et al., "EUV Mask Absorber Defect Repair with Focused Ion Beam," BACUS Symposium on Photomask Technology and Management, SPIE, vol. 3546, pp. 206–213 (1998).

Hector et al., "Predictive Model of the Cost of Extreme Ultraviolet Lithography Masks," 20th Annual BACUS Symposium on Photomask Technology, SPIE vol. 4186, pp. 733–748 (2001).

Vernon et al., "Masks for Extreme Ultraviolet Liathography," BACUS Symposium on Photomask Technology and Management, SPIE vol. 3546, pp. 184–193 (1998).

Tennant et al., "Reflective Mask Technologies and Imaging Results in Soft X–ray Projection Lithography," J. Vac. Sci. Technol. B., American Vacuum Society, pp. 3176–3183 (1991).

* cited by examiner

METHOD OF MAKING AN INTEGRATED CIRCUIT USING A REFLECTIVE MASK

FIELD OF THE INVENTION

This invention relates to methods for making integrated circuits and more particularly methods for making integrated circuits using EUV lithography and the reflective masks therefor.

BACKGROUND OF THE INVENTION

In making integrated circuits it is desirable to improve the lithography by using shorter and shorter wavelengths for exposing photoresist on semiconductor wafers. These shorter wavelengths allow for higher resolution and require special masks for achieving that higher resolution. One of the techniques that is being developed for high volume manufacturing is using extreme ultraviolet (EUV) frequencies, which have very short wavelengths. Wavelengths from 4 to 25 nanometers (nm) are considered EUV. This technology generally requires a reflective mask, as distinct from a transmission mask, because materials useful as mask materials tend to have high absorption at EUV wavelengths. EUV light is reflected off of the mask and exposes the photoresist according to the pattern of mask. The mask has a reflective portion and an absorber portion so that the reflective pattern is what is actually exposed on the photoresist. In making these masks, the features that are ultimately reflected onto the integrated circuit are extremely fine features. Accordingly, the mask must be extremely high quality and only provide the desired pattern.

Masks without any defects are very difficult to achieve so these masks are made in such a way that they are repairable in order to achieve the actual desired pattern. In order to effectively achieve the repair the mask must be inspected very accurately so that all of the flaws are found. These flaws occur generally in one of two categories. One category is that a portion of an absorber layer is removed where it should be present. Another category is that there is absorber material in areas where it should not be present. In order to locate these two categories of defects, equipment has been developed for this purpose. The equipment images the masks at a wavelength that affects the ability to accurately achieve the desired inspection. A common frequency currently utilized is in the deep ultra-violet (DUV) range of 240 to 260 nanometers, which is more than an order of magnitude greater than the EUV wavelengths that are used for generating the photoresist pattern on the semiconductor wafer. The wavelength utilized for inspection results in limited resolution between the areas where absorber material is intended to be present and where it is not intended to be present. Maximizing the inspection image contrast is critical in being able to be certain that all of the defects are detected.

Another issue with current EUV masks is that there is some absorber leakage that is exacerbated by a buffer layer between the absorber material and the reflective material. This buffer layer is typically a dielectric material that is used as a repair buffer that protects the reflective layer during the repair of the absorber layer. The increased absorber leakage due to this buffer layer results in the boundary between where the photoresist is to be exposed and where it is not to be exposed on the integrated circuit being fuzzier than it would be without the increased absorber leakage.

Accordingly, there is a need for a mask that is more easily inspected by providing a higher contrast between the absorber areas and the non-absorber areas and for a reduction in absorber leakage.

BRIEF DESCRIPTION OF THE DRAWINGS

The present invention is illustrated by way of example and not by limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DESCRIPTION OF THE INVENTION

In one embodiment a reflecting mask is made to have an EUV absorber layer immediately over the reflective layer and a DUV anti-reflective coating (ARC) over the absorber layer. The DUV ARC improves contrast for performing mask inspection in preparation for repair while the absorber layer being immediately over the reflective layer improves absorber leakage.

Figure 1:
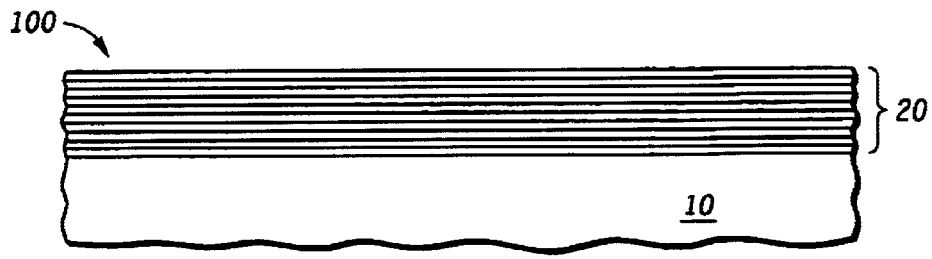
FIGS. 1–6 show cross sections of a mask in consecutive stages of fabrication according to an embodiment of the invention.

Shown in FIG. 1 is a mask 100 comprising a substrate 10 having an overlying reflective layer 20. Reflective layer 20 comprises a plurality of alternating silicon and molybdenum layers. In current practice the number of layers is 40 of each and may be covered by a thin capping layer of silicon. These layers are chosen to provide high reflectivity of incident EUV wavelength of 13.4 nm. The thicknesses of these layers would be altered according to changes that may occur in the particular wavelength of the EUV light that is used. For the wavelength of 13.4 nm the desired thickness of the silicon layers is about 4 nm and the desired thickness of the molybdenum layers is about 3 nm.

Figure 2:
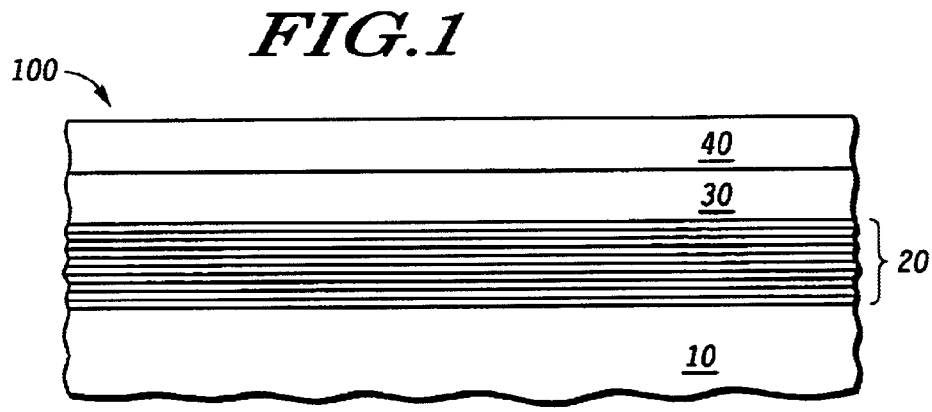

Shown in FIG. 2 is mask 100 after an absorber layer 30 and an ARC layer 40 have been deposited over reflective layer 20. Absorber layer 30 is chromium of about 70 nanometers in thickness, which provides more than 99 percent absorption of the incident EUV at that thickness. Other materials being considered for use as an absorber layer include tantalum nitride, tantalum silicon nitride, tantalum silicon oxide, chromium nitride, tungsten, and ruthenium. Other metals may be found to be useful as well. ARC 40 is deposited over absorber layer 30. ARC 40 is a dielectric material that is preferably silicon oxide, silicon nitride, or aluminum oxide but may also be silicon oxynitride.

The thickness of ARC 40 is chosen to be a thickness that causes a delay of one-quarter wavelength of the incident light. Thus light that passes through ARC 40 and reflected from absorber layer 30 passes through ARC 40 twice and is thus 180 degrees out of phase with light reflected from the top surface of ARC 40 causing destructive interference. In this case the incident light is with respect to the inspection equipment that presently is in the DUV range (240 to 260 nm). To obtain a one quarter wavelength delay with ARC 40, experiments must be run. The material chosen will make a significant difference. The particular processes used to make the material chosen for ARC 40 will also affect its optical constants such as index of refraction and extinction coefficient. Also, the inspection wavelength may be different so that would affect the thickness chosen as well. The absorber material chosen for absorber 30 will also have some effect on the thickness of ARC layer 40. Assuming a choice of one of silicon oxide, silicon nitride, silicon oxynitride, or aluminum oxide, the thickness should be in the range of 10 to 40 nm. The starting point for the experiments can be based on published information on the index of refraction of these materials and knowledge of the exact wavelength used by the particular inspection equipment.

A desirable characteristic for an ARC material 40 present on top of an absorber layer 30 is the capability of maintaining stable optical properties after long-term exposure to EUV radiation. From this perspective, silicon oxynitride, silicon oxide, or other kinds of films listed above, which are deposited by plasma enhanced chemical vapor deposition (PECVD), present a significant disadvantage. Films deposited by PECVD, particularly at low temperature, contain a high percentage of hydrogen, which evolves under the influence of ultraviolet light, altering the optical properties of the film. Thus, an advantageous deposition method of the ARC film 40 for an EUV mask is physical vapor deposition (PVD) in which hydrogenation of the deposited film is not involved and low temperature deposition below 150 degrees Celsius is not a difficulty. Thus, exemplary films for ARC 40 comprising silicon oxide, aluminum oxide, and silicon nitride deposited by PVD provide the benefit of not having their optical properties altered under the long term exposure to EUV radiation due to the evolution of hydrogen.

Figure 3:
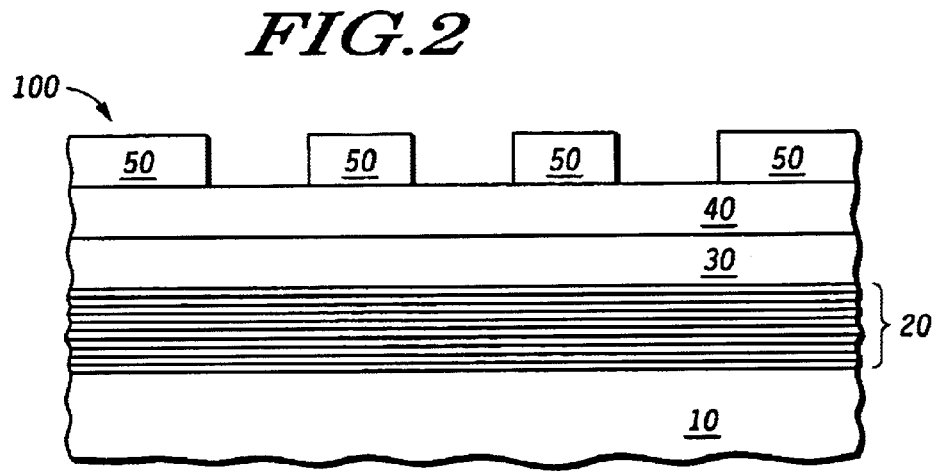

Shown in FIG. 3 is mask 100 after deposition and subsequent patterning of a photoresist layer 50. The pattern that is actually formed in the photoresist typically will be somewhat different from the desired pattern. This is an undesirable characteristic but one which has been found to be the case in the making of masks.

Figure 4:
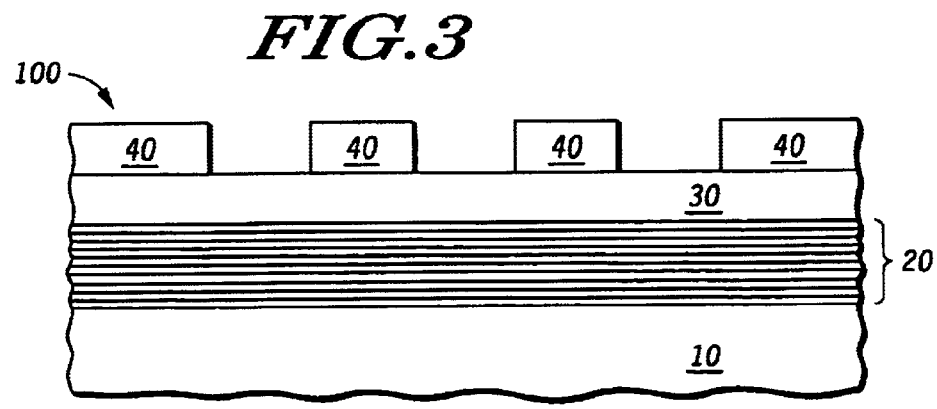

Shown in FIG. 4 is the transfer of the pattern in photoresist 50 to ARC 40. This is achieved by an etch of ARC 40 using patterned photoresist layer 50 as a mask. This etchant is chosen to be selective between the material of ARC 40 and the material of absorber 30 to avoid any significant etching of absorber layer 30 at this point in the process. Such etchants are known. One such etchant is CHF3. Thus, ARC 40, shown in FIG. 4, is patterned according to the pattern in photoresist 50. This pattern present in patterned ARC 40 is inspected for defects. These defects can be either extraneous ARC material or may be areas that need additional ARC material. With ARC 40 being silicon oxynitride with a quarter wavelength thickness at DUV inspection wavelengths, excellent contrast is generated between DUV light reflected from absorber layer 30 and ARC layer 40.

Figure 5:
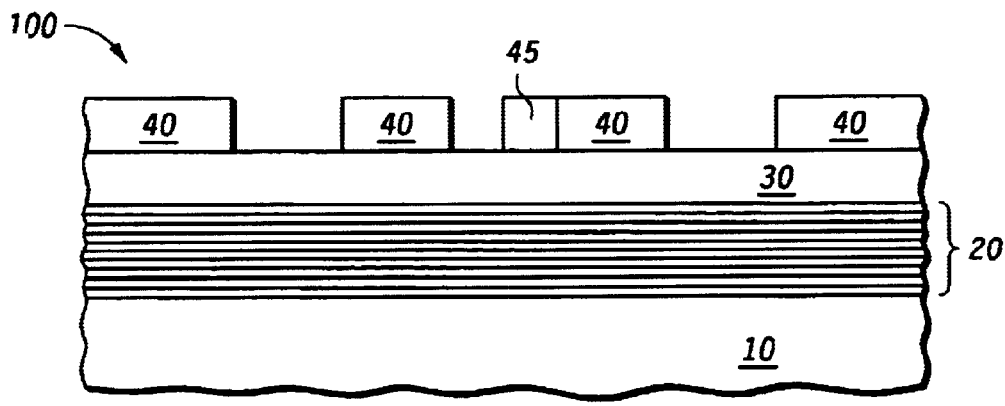

Shown in FIG. 5 is mask 100 after a repair of patterned ARC 40 has been performed. This shows an additional portion 45 added to patterned ARC 40 to achieve the desired pattern. Material from patterned ARC 40 may also be removed as needed in obtaining the desired pattern. In this case no material is depicted as being required to be removed from patterned ARC layer 40. Thus the patterned ARC 40 plus portion 45, as shown in FIG. 5, results in a repaired mask with the desired pattern. The material chosen for portion 45 is platinum, which is effective for focused ion beam (FIB) repair. If material were to be removed, it would be removed also by FIB. FIB repair for both removal and replacement is known in the art.

Figure 6:
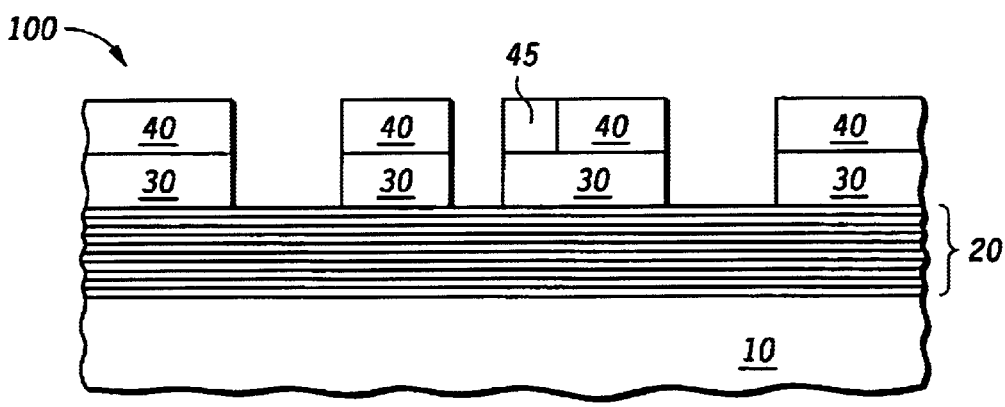

Shown in FIG. 6 is mask 100 after the desired pattern present in FIG. 5 is transferred to absorber layer 30. This is achieved by an etch of absorber layer 30 using the repaired ARC layer 40 as an etch mask. The etchant is chosen to be selective between the material of absorber layer 30 and the material of ARC layer 40 as well as reflective layer 20. Such etchants are well known. For the chromium absorber case, the mixture of Chlorine (Cl2) and Oxygen (O2) is one such etchant. The result is preferably a patterned absorber layer 30 according to the desired pattern. After the etch of absorber layer 30, another inspection is performed. After the inspection, if additional defects are found, then those are repaired. Generally, the number of repairs, if any, is quite small after the initial repairs to ARC layer 40 prior to the patterning of absorber layer 30. Mask 100 shown in FIG. 6 is the completed mask.

Figure 7:
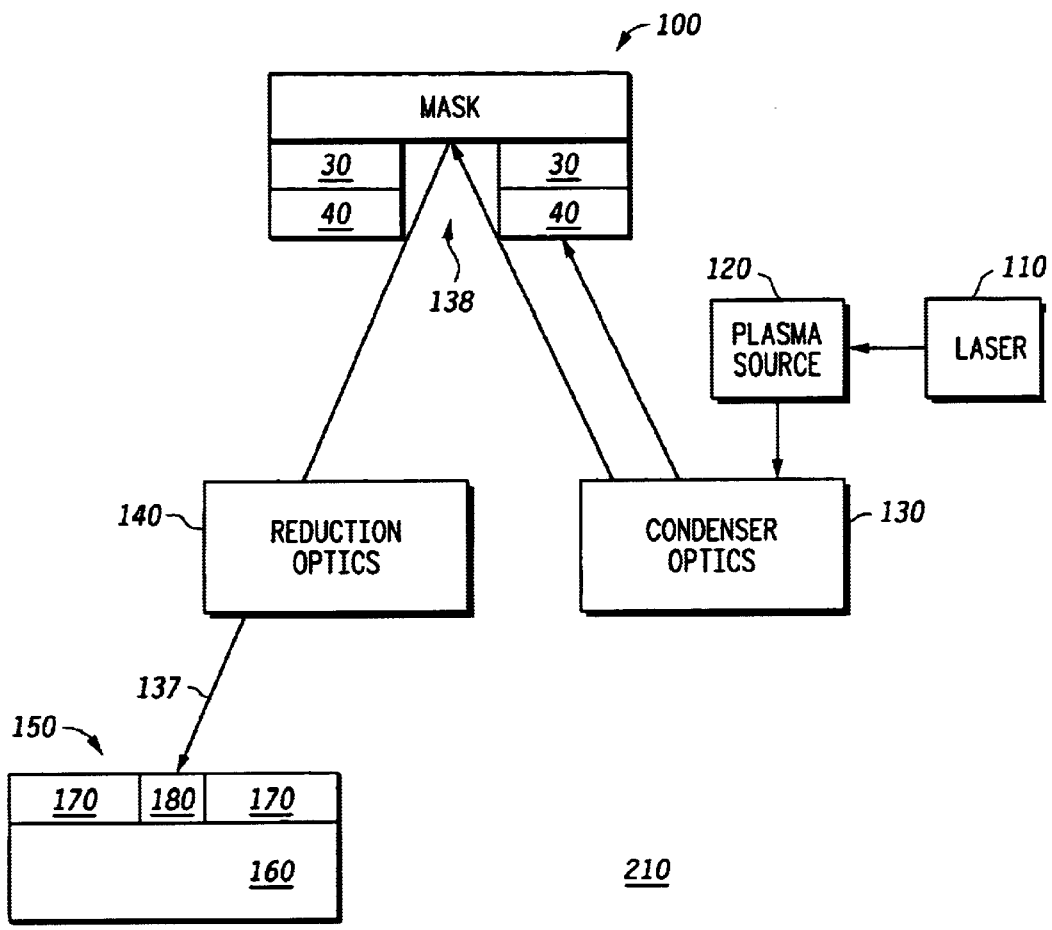
FIG. 7 shows an apparatus using the mask to make an integrated circuit.

Shown in FIG. 7 is an apparatus 210 comprising mask 100 with patterned absorber layer 30 and patterned ARC layer 40, a laser 110, a plasma source 120, condenser optics 130, reduction optics 140, and a semiconductor wafer 150. Laser 110 provides a source to energize the plasma source 120. Plasma source 120 provides the EUV that is transmitted to the condenser optics 130. Condenser optics 130 illuminates mask 100 that reflects the EUV according to the pattern on mask 100. With the proper repairs, mask 100 should have the desired pattern. The reflected EUV passes through reduction optics 140 and is imaged onto wafer 150. Wafer 150 has a substrate 160 that has at least a layer of semiconductor material on it. Over this substrate 160 is a photoresist layer having an exposed portion 180 and an unexposed portion 170. Exposed portion 180 corresponds to a region 138 shown with respect to mask 100. Regions 170 correspond to the areas where absorber layer 30 and ARC layer 40 are present. Mask 100 is simplified in all the drawings to show a very small number of features to aid the explanation of the invention. In an actual mask, there would typically be millions, even billions, of features on a mask. The number is steadily increasing.

Mask 100 provides a benefit of excellent contrast between the area where absorption is to occur compared to areas where reflection is to occur at the wavelengths used for inspection. The result is a high degree of ability to find all of the defects in the pattern, to repair all of the defects, and thereby to achieve the desired pattern. This provides for the ability to avoid scrapping masks during production. Another benefit is that absorber layer 30 is in direct contact with reflective layer 20. Thus, there is not a space between the absorber layer 30 and the reflective layer 20. This results in reduced absorber leakage and the attendant unwanted image blurring.

Mask 100 as shown in FIG. 6 and FIG. 7 includes ARC layer 40 as the finished mask. An alternative is to remove ARC 40 that would provide the benefit of reducing the height of the patterned material. On the other hand an advantage of leaving ARC 40 on mask 100 is that postproduction inspection of mask 100 would be more easily facilitated. After a mask has been in production for a while it is often desirable to inspect it again. Such subsequent inspections would be more effective and reliable with the ARC 40 present. The materials chosen for ARC 40, absorber 30, and reflective layer 20 have been found to be effective, but other materials may also be effective. For example, ARC 40 may be another dielectric material such as silicon oxide, aluminum oxide, aluminum nitride or boron carbide. At present it is considered desirable to keep processing temperatures below 150 degrees Celsius after deposition of reflective layer 20. If that temperature can be raised, a greater selection of materials would be available. Similarly, absorber layer 30 is chosen to be chromium but other absorber materials may also be found to be useful especially if the temperature range can be raised for depositions. Repair material used for portion 45 can also be varied. In this example, portion 45 was platinum. Other alternatives include tungsten and tantalum. Currently FIB is used for layer repair, but other techniques may become available. If the available temperature range for post reflective layer deposition changes, that will likely affect the choices for all of the materials.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of patterning a first photoresist layer on a semiconductor wafer using a reflective mask comprising:
   providing a mask substrate having a reflective layer;
   depositing an absorber layer over the reflective layer;
   depositing an anti-reflective coating (ARC) layer over the absorber layer;
   depositing a second photoresist layer over the ARC layer;
   patterning the second photoresist layer to form a patterned photoresist layer;
   etching the ARC layer using the patterned photoresist layer as a first mask to form a patterned ARC layer;
   removing the patterned photoresist layer;
      inspecting and repairing the patterned ARC layer to form a patterned repaired ARC layer, wherein at least the inspecting occurs prior to formation of any absorber layer over being formed over the ARC layer;
   etching the absorber layer using the patterned repaired ARC layer as a second mask to form a patterned absorber layer and an exposed area of the reflective layer;
   applying the first photoresist layer to the semiconductor wafer; and
   reflecting radiation off the exposed area of the reflective layer to the first photoresist layer on the semiconductor wafer to provide an exposed pattern on the first photoresist layer.

2. The method of claim 1, wherein the ARC layer is characterized as being selectively etchable with respect to the absorber layer.

3. The method of claim 2, wherein the ARC layer is a dielectric material.

4. The method of claim 3, wherein the ARC layer comprises silicon oxynitride.

5. The method of claim 1, wherein the absorber layer comprises a metal.

6. The method of claim 5, wherein the absorber layer comprises a material selected from the group consisting of chromium, chromium nitride, tantalum nitride, tantalum silicon nitride, tantalum silicon oxide and ruthenium.

7. The method of claim 1, wherein the reflective layer comprises a plurality of alternating layers of molybdenum and silicon.

8. The method of claim 1, wherein the absorber layer is selectively etchable with respect to the reflective layer.

9. The method of claim 1, wherein the ARC layer is a repairable layer.

10. The method of claim 1, wherein the reflective layer substantially reflects light at a wavelength between approximately 4 and 25 nm.

11. A method for obtaining a desired pattern of exposed photoresist on a semiconductor wafer, comprising:
    providing a mask substrate having a reflective layer;
    depositing an absorber layer over the reflective layer;
    depositing a repairable layer over the absorber layer;
    depositing a first photoresist layer over the repairable layer;
    patterning the first photoresist layer according to the desired pattern;
    transferring the desired pattern from the photoresist layer to the repairable layer;
    inspecting the repairable layer to determine if it has the desired pattern, wherein the inspecting occurs prior to any absorber layer being formed over the repairable layer;
    repairing the repairable layer to the desired pattern if inspecting showed that the repairable layer did not have the desired pattern;
    transferring the desired pattern from the repairable layer to the absorber layer to form a reflective mask;
    applying a second photoresist layer to the semiconductor wafer; and
    reflecting radiation off the reflective mask to expose the second photoresist with the desired pattern.

12. The method of claim 11, wherein the repairable layer is an ARC layer deposited by PVD.

13. The method of claim 12, wherein the reflective layer comprises a plurality of alternating molybdenum and silicon layers and the repairable layer is a dielectric material.

14. The method of claim 13, wherein the repairable layer is silicon oxynitride.

15. The method of claim 11, wherein the absorbing layer comprises a material that is selectively etchable with respect to the reflective layer.

16. The method of claim 15, wherein the repairable layer comprises a material that is selectively etchable with respect to the absorbing layer.

17. The method of claim 16, wherein the reflective layer comprises a plurality of alternating layers of molybdenum and silicon, the absorber layer comprises a metal, and the repairable layer comprises a dielectric material.

18. The method of claim 11, wherein the absorber layer is in direct contact with the reflective layer.

19. A method for forming a desired pattern on a semiconductor wafer, comprising;
    providing a mask substrate having a reflective layer;
    depositing an absorber layer, which is selectively etchable with respect to the reflective layer, on the reflective layer;
    depositing an ARC layer over the absorber layer, wherein the ARC layer is a dielectric material;
    patterning the ARC layer according to the desired pattern;
    inspecting the ARC layer after patterning the ARC layer, wherein the inspecting occurs prior to forming any absorber layer over the ARC layer;

repairing the ARC layer to the desired pattern if inspecting showed that the ARC layer did not have the desired pattern;

transferring the desired pattern from the ARC layer to the absorber layer to form a reflective mask;

using the reflective mask to form the desired pattern on the semiconductor wafer.

20. The method of claim 19 wherein the step of depositing the ARC layer is further characterized as being performed by physical vapor deposition.

* * * * *

UNITED STATES PATENT AND TRADEMARK OFFICE
CERTIFICATE OF CORRECTION

PATENT NO. : 6,673,520 B2
DATED : January 6, 2004
INVENTOR(S) : Han et al.

It is certified that error appears in the above-identified patent and that said Letters Patent is hereby corrected as shown below:

Column 5,
Line 44, change "layer over being" to -- layer being --

Signed and Sealed this

Twenty-second Day of June, 2004

JON W. DUDAS
*Acting Director of the United States Patent and Trademark Office*